United States Patent
Tang et al.

(10) Patent No.: US 8,703,514 B2
(45) Date of Patent: Apr. 22, 2014

(54) ACTIVE ARRAY SUBSTRATE AND METHOD FOR MANUFACTURING THE SAME

(75) Inventors: Wen-Chung Tang, Hsinchu (TW); Fang-An Shu, Hsinchu (TW); Yao-Chou Tsai, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 32 days.

(21) Appl. No.: 13/481,962

(22) Filed: May 29, 2012

(65) Prior Publication Data

US 2013/0043474 A1   Feb. 21, 2013

Related U.S. Application Data

(60) Provisional application No. 61/525,167, filed on Aug. 18, 2011.

(30) Foreign Application Priority Data

Jan. 16, 2012   (TW) .............................. 101101600 A

(51) Int. Cl.
   *H01L 29/786* (2006.01)
(52) U.S. Cl.
   USPC .................. 438/34; 438/30; 257/59
(58) Field of Classification Search
   USPC ......................... 257/59; 438/34, 30
   See application file for complete search history.

(56) References Cited

U.S. PATENT DOCUMENTS

| | | | |
|---|---|---|---|
| 6,140,158 A | 10/2000 | Rhee et al. | |
| 6,387,738 B2 | 5/2002 | Kim | |
| 7,491,593 B2 | 2/2009 | Lin | |
| 2006/0121643 A1 | 6/2006 | Seo et al. | |
| 2006/0223282 A1* | 10/2006 | Amundson et al. | 438/458 |
| 2008/0308826 A1* | 12/2008 | Lee et al. | 257/98 |
| 2009/0108260 A1* | 4/2009 | Lin et al. | 257/59 |
| 2009/0311809 A1* | 12/2009 | Miyairi et al. | 438/22 |
| 2009/0317941 A1* | 12/2009 | Seo et al. | 438/99 |

* cited by examiner

*Primary Examiner* — Eugene Lee
(74) *Attorney, Agent, or Firm* — CKC & Partners Co., Ltd.

(57) ABSTRACT

Disclosed herein is a method for manufacturing an active array substrate. The method includes the steps of: forming a first patterned metal layer on a substrate; sequentially forming a semiconductor layer, an insulating layer and a second metal layer to cover the first patterned metal layer; forming a patterned photoresist layer on the second metal layer; patterning the second metal layer, the insulating layer and the semiconductor layer to form a second patterned metal layer, a patterned insulating layer and a patterned semiconductor layer, and removing a portion of the patterned photoresist layer; heating the remained portion of the patterned photoresist layer such that the remained portion is fluidized and transformed into a protective layer; and forming a pixel electrode.

10 Claims, 6 Drawing Sheets

100 forming a first patterned metal layer on a substrate — 110 sequentially forming a semiconductor layer, a insulating layer and a second metal layer to cover the first patterned metal layer — 120 forming a patterned photoresist layer on the second metal layer — 130 patterning the second metal layer, the insulating layer and the semiconductor layer, and removing a portion of the patterned photoresist layer — 140 heating the remained portion of the patterned photoresist layer — 150 forming a pixel electrode — 160

ACTIVE ARRAY SUBSTRATE AND METHOD FOR MANUFACTURING THE SAME

CROSS REFERENCE TO RELATED APPLICATIONS

This application claims priority to U.S. Provisional Application Ser. No. 61/525,167 filed Aug. 18, 2011, and Taiwan Application Serial Number 101101600, filed Jan. 16, 2012, the disclosures of which are incorporated herein by reference in their entireties.

BACKGROUND

1. Technical Field

The present disclosure relates to an active array substrate for a display device and a method for manufacturing the active array substrate.

2. Description of Related Art

Flat display devices such as liquid crystal display devices are widely applied in various types of electronic products. Flat display devices usually include active array substrates for driving the pixels of the display devices. In general, five photolithography processes are necessarily performed in conventional methods of fabricating the active array substrates. However, each photolithography process implies an increase in production costs. In recent years, a method using only four photolithography processes is developed to cost-effectively fabricate the active array substrates. In order to more effectively reduce production costs and enhance production efficiency, there exists in this art a need for a new method of fabricating the active array substrates.

SUMMARY

One object of the present disclosure is to provide a method for manufacturing an active array substrate. The method is characterized in that only three photolithography processes are required to manufacture the active array substrate, and the active array substrate has excellent reliability. Accordingly, the embodiments disclosed herein can be much more cost-effective, and the active array substrate exhibits excellent performance and reliability.

In the method for manufacturing an active array substrate according to one aspect of the present disclosure, the method includes the following steps: (a1)) forming a first patterned metal layer on a substrate; (a2) sequentially forming a semiconductor layer, an insulating layer and a second metal layer to cover the first patterned metal layer; (a3) forming a patterned photoresist layer on the second metal layer; (a4) patterning the second metal layer, the insulating layer and the semiconductor layer to form a second patterned metal layer, a patterned insulating layer and a patterned semiconductor layer, and removing a portion of the patterned photoresist layer; (a5) heating the other portion of the patterned photoresist layer such that the other portion of the patterned photoresist layer is fluidized and transformed into a protective layer to cover a side wall of the second patterned metal layer, a side wall of the patterned insulating layer, a side wall of the patterned semiconductor layer and a portion of the first patterned metal layer; and (a6) forming a pixel electrode on the substrate and the protective layer, wherein the pixel electrode is electrically connected to another portion of the first patterned metal layer exposed out of the protective layer.

In the method for manufacturing an active array substrate according to another aspect of the present disclosure, the method includes the following steps: (b1) forming a first patterned metal layer on a substrate, wherein the first patterned metal layer includes a drain electrode, a source electrode and a data pad; (b2) sequentially forming a semiconductor layer, an insulating layer and a second metal layer to cover the drain electrode, the source electrode and the data pad on the substrate; (b3) forming a patterned photoresist layer on the second metal layer, wherein the patterned photoresist layer includes a first portion, a second portion and a third portion, the first portion has a surrounding portion and an opening exposing a portion of the second metal layer, the opening is surrounded by the surrounding portion, the second portion has an inner portion and a peripheral portion surrounding the inner portion, and the inner portion has a thickness less than a thickness of the peripheral portion; (b4) patterning the second metal layer, the insulating layer and the semiconductor layer to form a surrounding wall under the first portion, a gate pad under the second portion, and a stack of a gate electrode, a gate insulating layer and a channel layer under the third portion, and removing the inner portion of the second portion to expose a portion of the gate pad, wherein the surrounding wall surrounds the data pad, and the channel layer is connected with the drain electrode and the source electrode; (b5) heating a remained portion of the patterned photoresist layer such that the remained portion of the patterned photoresist layer is fluidized and transformed into a protective layer to cover the gate electrode, the gate insulating layer, the channel layer, the surrounding wall and an edge of the gate pad, wherein a portion of the drain electrode is exposed out of the protective layer; and (b6) forming a pixel electrode on the substrate and the protective layer, wherein the pixel electrode is electrically connected to the exposed portion of the drain electrode.

Another object of the present disclosure is to provide an active array substrate. The active array substrate includes a substrate, a source electrode and a drain electrode, a channel layer, an insulating layer, a gate electrode, a protective layer and a pixel electrode. Both the source electrode and the drain electrode are disposed on the substrate. The channel layer is disposed on the source electrode and the drain electrode. The insulating layer is disposed on the channel layer. The gate electrode is disposed on the insulating layer, in which the channel layer, the insulating layer and the gate electrode have a substantially identical pattern. The protective layer covers the channel layer, the insulating layer, the gate electrode, the source electrode and a portion of the drain electrode. The pixel electrode is disposed on the substrate and the protective layer, and the pixel electrode is electrically connected to the drain electrode.

It is to be understood that both the foregoing general description and the following detailed description are by examples, and are intended to provide further explanation of the invention as claimed.

BRIEF DESCRIPTION OF THE DRAWINGS

FIG. 1 is a flow chart showing a method for manufacturing an active array substrate according to one embodiment of the present disclosure;

DETAILED DESCRIPTION

Figure 2:
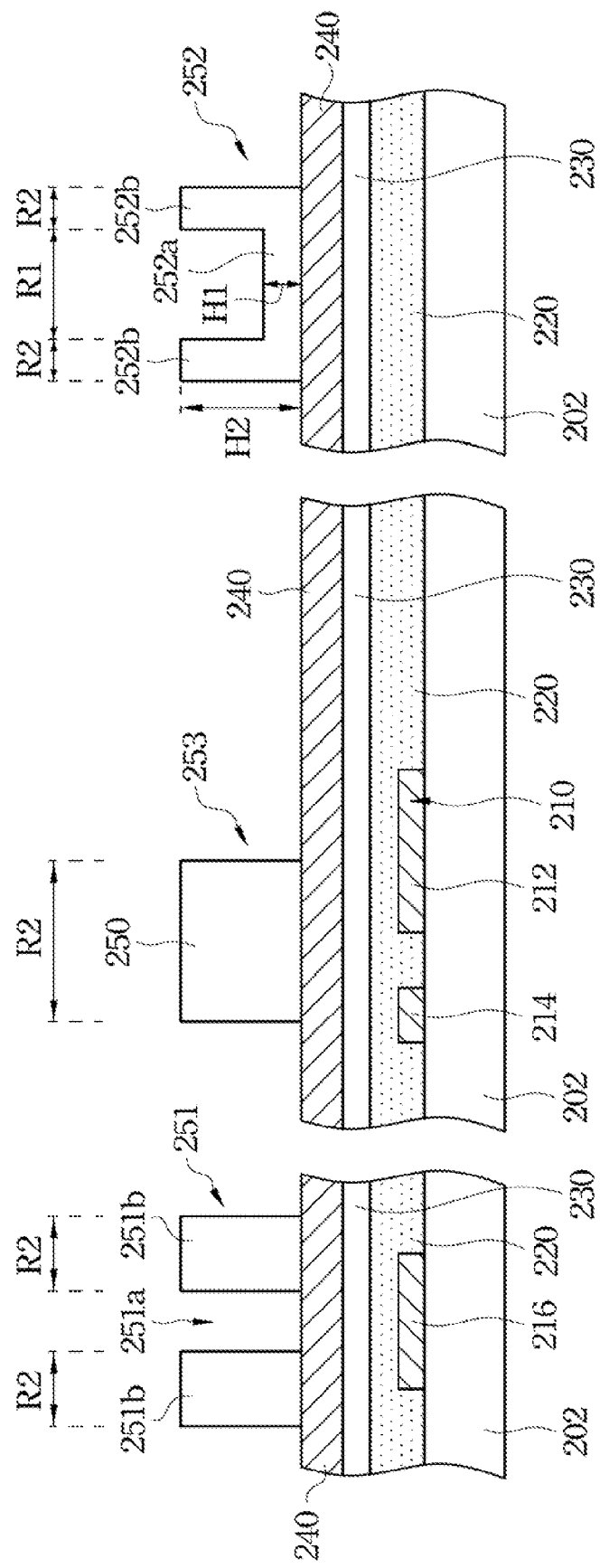
FIGS. 2, 3A, 4 and 5 are cross-sectional views schematically illustrating the process steps of the method illustrated in FIG. 1.

Reference will now be made in detail to the present embodiments of the disclosure, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

FIG. 1 is a flow chart showing a method 100 for manufacturing an active array substrate according to one embodiment of the present disclosure. FIGS. 2, 3A, 4 and 5 are cross-sectional views schematically illustrating the process steps of the method 100. The active array substrate fabricated by the method 100 may be applied in various types of display devices such as thin film transistor liquid crystal display, electronic paper and organic light emitting device.

In step 110, a first patterned metal layer 210 is formed on a substrate 202, as depicted in FIG. 2. The first patterned metal layer 210 may be formed by any method known in the art. For instance, a metal layer may be blanket deposited on the substrate 202, and then a photolithography process may be carried out to form the first patterned metal layer 210. The first patterned metal layer 210 may be a signal layer or a stack of multiple layers. In one example, the material of the first patterned metal layer 210 may be molybdenum (Mo), chromium (Cr), aluminum (Al), neodymium (Nd), titanium (Ti), or an alloy thereof or a combination thereof. The substrate 202 may be made of glass or polymeric material, for example.

In one embodiment, the first patterned metal layer 210 includes a drain electrode 212, a source electrode 214 and a data pad 216. The drain electrode 212 and the source electrode 214 are configured to form an active component of the active array substrate. The data pad 216 is provided to connect with an integrated circuit (IC, not shown), and the data pad 216 is electrically connected to the drain electrode 212. Accordingly, voltage signal generated by the IC may be transmitted through the data pad 216 to the drain electrode 212.

Figure 3A:
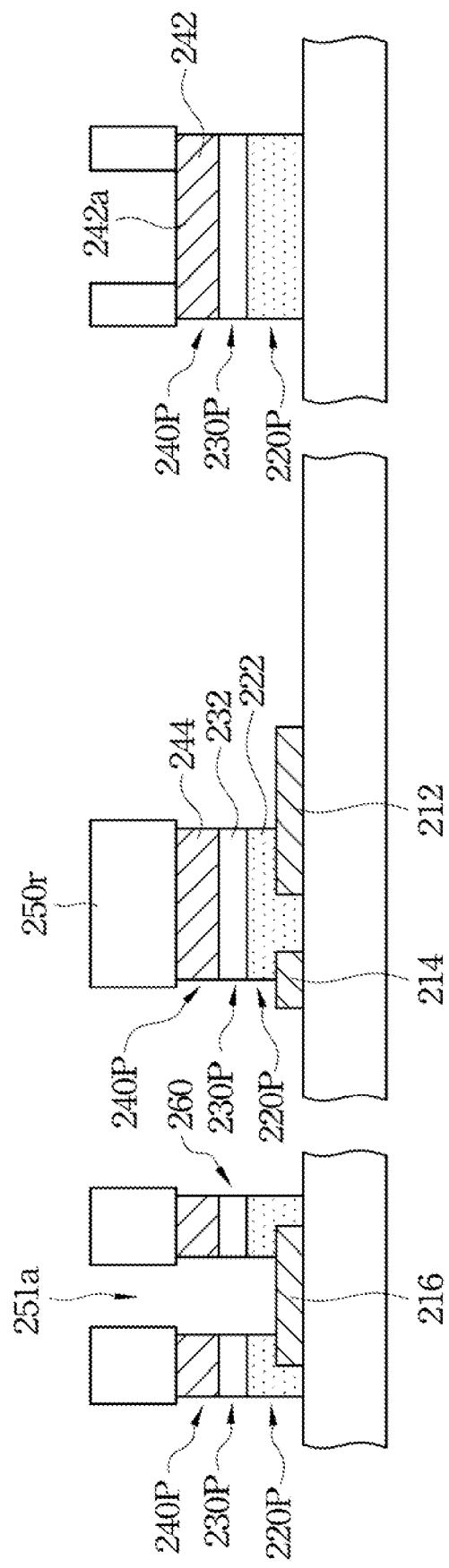
Figure 3B:
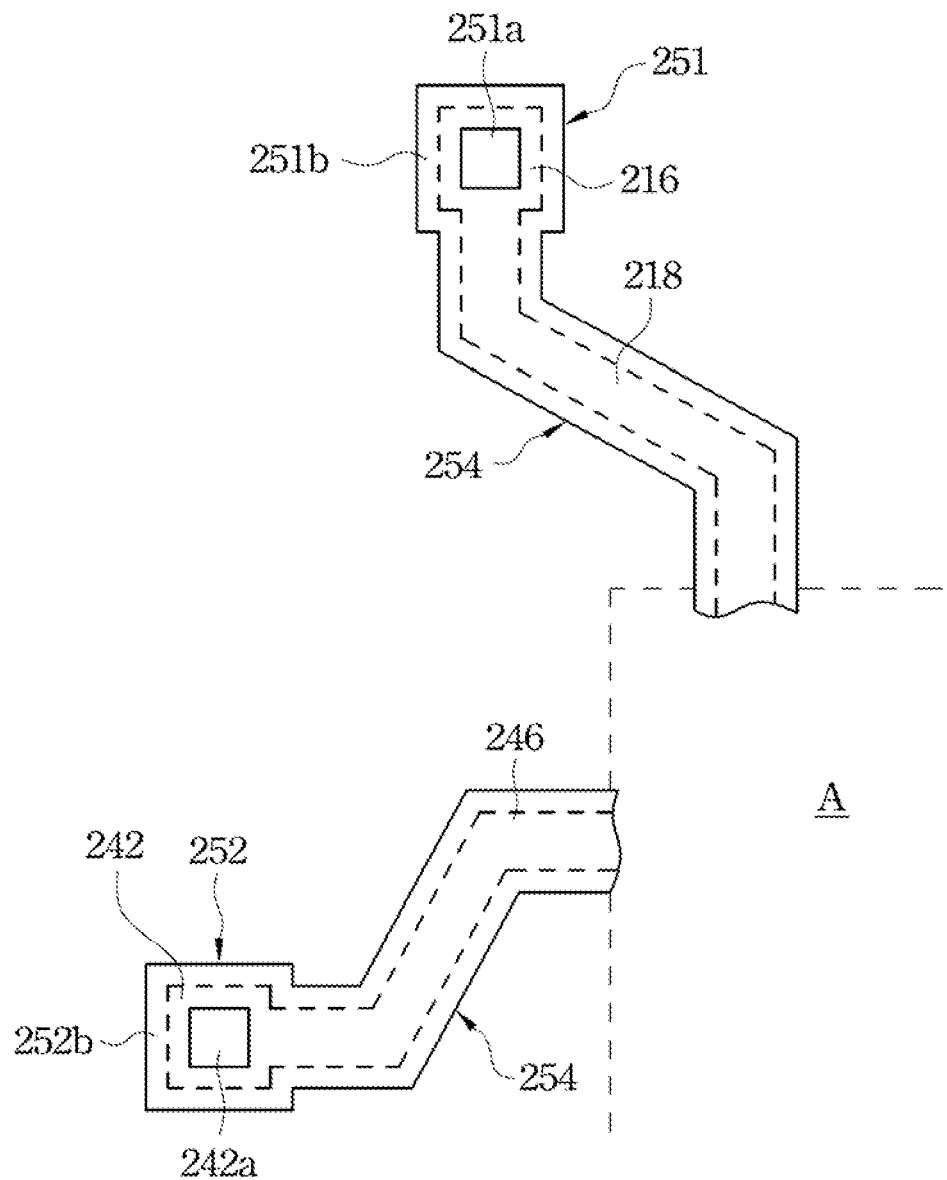
FIG. 3B is a top view schematically illustrating a resultant structure after step 140 according to one embodiment of the present disclosure.

In one example, the first patterned metal layer 210 further includes a data line 218 (depicted in FIG. 3B). The data line 218 is connected with the data pad 216 and the source electrode 214. In addition, all of the drain electrode 212, the source electrode 214, the data pad 216 and the data line 218 are simultaneously formed in a single photolithography process in this example.

In step 120, a semiconductor layer 220, an insulating layer 230 and a second metal layer 240 are sequentially blanket formed to cover the first patterned metal layer 210, as depicted in FIG. 2. In one embodiment, the semiconductor layer 220 is deposited first, and then the insulating layer 230 is deposited on the semiconductor layer 220. Subsequently, the second metal layer 240 may be deposited on the insulating layer 230. Therefore, the semiconductor layer 220 is in contact with and covers the drain electrode 212, source electrode 214 and the data pad 216 on the substrate 202.

Conventional materials and technologies may be employed in step 120. For instance, the semiconductor layer 220 may be made of amorphous silicon (a-Si), polycrystalline silicon (poly-Si), organic semiconductor or metal oxide semiconductor such as amorphous-indium gallium zinc oxide (a-IGZO), indium zinc oxide (IZO) and amorphous-indium zinc tin oxide (a-IZTO). The insulating layer 230 may be made of material such as silicon oxide, silicon nitride or organic insulating material. The material of the second metal layer 240 may be the same as or different from that of the first patterned metal layer 210. In examples, the second metal layer 240 may include at least one material selected from the group consisting of Mo, Cr, Al, Nd, and Ti. The processes of forming the semiconductor layer 220, the insulating layer 230 and the second metal layer 240 may vary depending on the materials used.

In step 130, a patterned photoresist layer 250 is formed on the second metal layer 240, as depicted in FIG. 2. The patterned photoresist layer 250 covers a portion of the second metal layer 240 whereas another portion of the second metal layer 240 is exposed. The patterned photoresist layer 250 has a first region R1 and a second region R2, in which the thickness H1 of the first region R1 is less than the thickness H2 of the second region R2. In one example, an exposure process using a half-tone reticle may be used to form the first region R1 and the second region R2 of the patterned photoresist layer 250.

In one embodiment, patterned photoresist layer 250 includes a first portion 251 and a second portion 252, as depicted in FIG. 2. The first portion 251 is positioned above the data pad 216, and has an opening 251a and a surrounding portion 251b that encircles the opening 251a. The opening 251a exposes a portion of the second metal layer 240. The second portion 252 is utilized to form a gate pad in the following steps (it is described in detail in step 140 hereinafter). The second portion 252 has an inner portion 252a and a peripheral portion 252b. The peripheral portion 252b surrounds inner portion 252a, and the thickness H1 of the inner portion 252a is less than the thickness H2 of the peripheral portion 252b. In this embodiment, the patterned photoresist layer 250 further includes a third portion 253 located substantially above both the drain electrode 212 and the source electrode 214. The third portion 253 is utilized to form a gate electrode, a gate insulating layer and a channel layer in the following steps (it is described in detail in step 140 hereinafter).

The surrounding portion 251b of the first portion 251, the peripheral portion 252b of the second portion 252 and the third portion 253 are located in the region R2. That is, each of the surrounding portion 251b, the peripheral portion 252b and the third portion 253 has a thickness of about H2. The inner portion 252a of the second portion 252 is located in the region R1, and the inner portion 252a has a thickness of about H1.

In examples, the patterned photoresist layer 250 may be formed by coating and drying a coating composition that includes a photoresist material and performing a half-tone exposure, a developing and a post-back process. The post-back process may be carried out in an environment at a temperature of about 100° C. to about 150° C. such that the resultant photoresist pattern may be dried and/or cured after the developing process, and thus forming the patterned photoresist layer 250.

In one embodiment, the patterned photoresist layer 250 may be a photoresist material containing any of acryl resin, epoxy resin, and phenolic resin. For example, photoresist such as AZ®-501 (provide by CLARIANT, Japan) may be utilized.

In step 140, the second metal layer 240, the insulating layer 230 under the second metal layer 240 and the semiconductor layer 220 under the second metal layer 240 are patterned, as depicted in FIG. 3A, to form a second patterned metal layer 240P, a patterned insulating layer 230P and a patterned semiconductor layer 220P.

In one embodiment, the exposed portion of the second metal layer 240 and the portions of the insulating layer 230 and the semiconductor layer 220 there under are removed by an etching process, in which the patterned photoresist layer 250 is used as a protective mask. Furthermore, the material of the first region R1 of the patterned photoresist layer 250 is removed during the etching process. The etching process may be performed by dry etching, wet etching, or a combination of dry etching and wet etching. In one example, the exposed portion of the second metal layer 240 is removed by a wet etching process, and subsequently a dry etching process is employed to remove the portions of the insulating layer 230 and the semiconductor layer 220 there under. Accordingly, the second patterned metal layer 240P, the patterned insulating layer 230P and the patterned semiconductor layer 220P have a substantially identical pattern in a top view. After the etching process is carried out, a portion of the drain electrode 212 is exposed out of the patterned semiconductor layer 220P. In addition, during the etching process, the etchant etches or dissolves a portion of the patterned photoresist layer 250 so that the thickness of the patterned photoresist layer 250 is reduced. Therefore, the material of the first region R1 of the patterned photoresist layer 250 may be removed during the etching process. In other words, when the etching process comes to or reaches the etch endpoint of the semiconductor layer 220, the etched thickness of the patterned photoresist layer 250 is about H1 so that the first region R1 of the patterned photoresist layer 250 is removed. Accordingly, the portion 242a of the second metal layer 240 under the first portion R1 is exposed. The remained photoresist layer 250r is capable of being transformed into a protective layer in the following step, and it is described in detail hereinafter.

In step 140, a surrounding wall 260 and a gate pad 242 may be formed under the patterned photoresist layer 250 in one embodiment of the present disclosure, as depicted in FIG. 3A. The surrounding wall 260 and the gate pad 242 are respectively under the first portion 251 and the second portion 252. Furthermore, a stack structure including a gate electrode 244, a gate insulating layer 232 and a channel layer 222 may be formed under the third portion 253 of the patterned photoresist layer 250. The channel layer 222 is connected with the drain electrode 212 and the source electrode 214. The surrounding wall 260 encircles the data pad 216, and a portion of the data pad 216 is exposed. It is noted that the inner portion 252a of the second portion 252 is removed during the patterning process, and thereby the portion 242a of the gate pad 242 is exposed.

FIG. 3B is a top view schematically illustrating a resultant structure after step 140 according to one embodiment of the present disclosure. There lies an active area A on the resultant substrate, and active components such as thin film transistor are disposed within the active area A. The gate pad 242 and the data pad 216 are positioned adjacent to the periphery of the active area A, and are respectively configured to connect to a gate driver IC (not shown) and a data driver IC (not shown). In this embodiment, a gate line 246 is simultaneously formed in step 140. Specifically, the gate line 246, the gate electrode 244 and the gate pad 242 are simultaneously formed by executing a single photolithography process. The patterned photoresist layer 250 further includes a fourth portion 254 located above both of the data line 218 and the gate line 246. Therefore, the data line 218 is covered by a stack structure composed of a part of the patterned semiconductor layer 220P, a part of the patterned insulating layer 230P and a part of the second patterned metal layer 240P. Under the gate line 246, there exists a stack structure composed of a part of the patterned insulating layer 230P and a part of the second patterned metal layer 240P.

Figure 4:
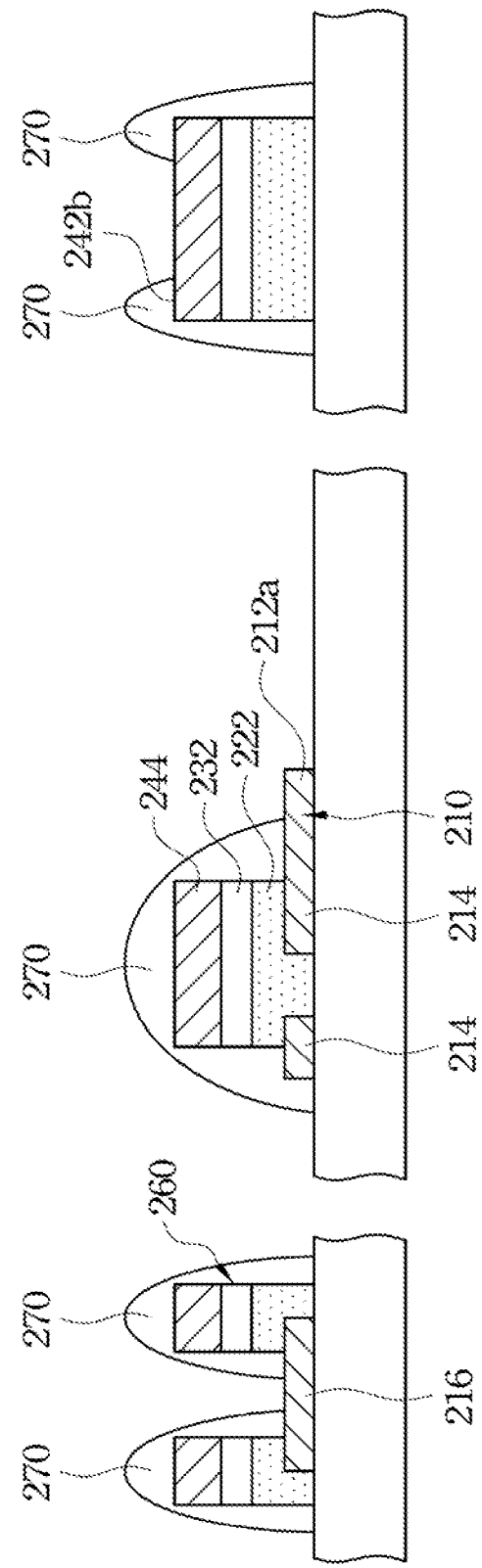

In step 150, the remained patterned photoresist layer 250r in the second region R2 is heated such that the remained patterned photoresist layer 250r is fluidized and transformed into a protective layer 270, as depicted in FIG. 4. The protective layer 270 covers a side wall of the second patterned metal layer 240P, a side wall of the patterned insulating layer 230P and a side wall of the patterned semiconductor layer 220P.

In one embodiment, by heating the remained patterned photoresist layer 250r, the remained patterned photoresist layer 250r is melted and flows to cover the gate electrode 244, the gate insulating layer 232, the channel layer 222, the surrounding wall 260 and an edge 242b of the gate pad 242, so that the remained patterned photoresist layer 250r is transformed into the protective layer 270. It is noted that the portion 212a of the drain electrode 212 is not covered by the protective layer 270 and is exposed out of the protective layer 270. In one example, the step of heating the remained patterned photoresist layer 250r includes subjecting the remained patterned photoresist layer 250r to an environment at a temperature of about 200° C. to about 400° C. such that the patterned photoresist layer 250r is melted and fluidized.

Figure 5:
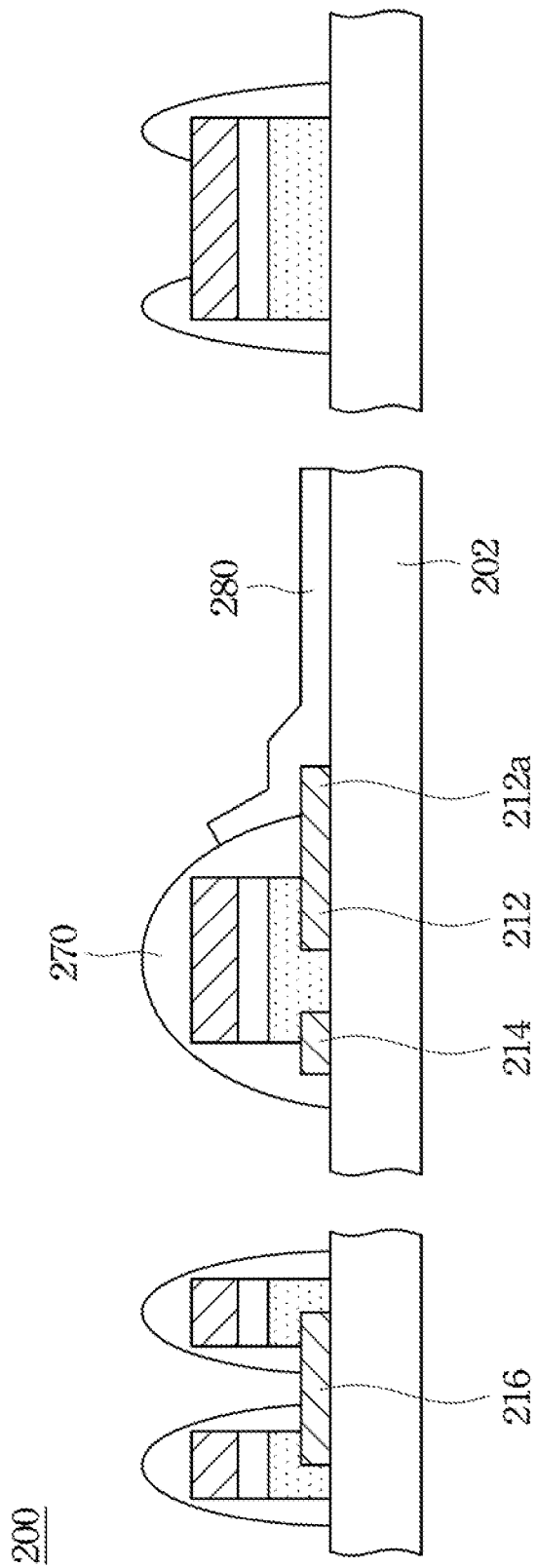

In step 160, a pixel electrode 280 is formed on the substrate 202 and the protective layer 270 so as to realize an active array substrate 200, as depicted in FIG. 5. The pixel electrode 280 may be electrically connected to the drain electrode 212. For example, the pixel electrode 280 may be in contact with the exposed portion 212a of the drain electrode 212. In one embodiment, the pixel electrode 280 may be made of a transparent conductive material such as indium tin oxide (ITO). In another embodiment, the pixel electrode 280 may be made of a material with a high reflectivity such as aluminum and sliver.

According to another aspect of the present disclosure, an active array substrate 200 is provided. The active array substrate 200 includes a substrate 202, a source electrode 212, a drain electrode 214, a channel layer 222, an insulating layer 230, a gate electrode 246, a protective layer 270 and a pixel electrode 280. The source electrode 212 and the drain electrode 214 are located on the substrate 202. The channel layer 222 is disposed on the source electrode 212 and drain electrode 214. The insulating layer 230 is disposed on the channel layer 222. The gate electrode 246 is disposed on the insulating layer 230. The channel layer 222, the insulating layer 230 and the gate electrode 246 have a substantially identical pattern in a top view. The protective layer 270 covers the channel layer 222, the insulating layer 230, the gate electrode 246, the source electrode 212 and a portion of the drain electrode 214. The pixel electrode 280 is disposed on the substrate 202 and the protective layer 270, and is electrically connected to the drain electrode 214.

According to the embodiments disclosed hereinbefore, only three photolithography processes are required to manufacture the active array substrate 200. The first photolithography process is performed to form the first patterned metal layer 210, which includes the drain electrode 212, the source electrode 214, the data line 218 and/or the data pad 216. The second photolithography process is performed to fabricate the patterned semiconductor layer 220P, the patterned insulating layer 230 P and the second patterned metal layer 240P. Specifically, components such as the gate electrode 244, the gate line 246, the gate insulating layer 232, the channel layer 222 and/or the gate pad 242 may be formed by the second photolithography process. The third photolithography process is performed to form the pixel electrode 280. Accordingly, the embodiments disclosed herein provide a cost-effective method of manufacturing active array substrates, and the production costs may significantly be reduced.

Moreover, the protective layer 270 ensures the reliability of the gate pad 242 and the data pad 216 because the protective layer 270 covers the peripheries of both the gate and data pads 242, 216. In particular, when driver ICs are mounted to the gate pad 242 and/or the data pad 216, the elastic protective layer 270 provides elasticity to the pad structures (i.e., surrounding wall 260 and gate pad 242) and prevents the pad structures from cracking. The protective layer 270 may further prevent the gate and data pads 242, 216 from erosion caused by moisture and oxygen. In addition, the gate electrode 244, the gate insulating layer 232 and the channel layer 222 of the active component are covered by the protective layer 270 so that the active component has an excellent reliability.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for manufacturing an active array substrate, comprising:
    forming a first patterned metal layer on a substrate, the first patterned metal layer comprising a data pad;
    sequentially forming a semiconductor layer, an insulating layer and a second metal layer to cover the first patterned metal layer;
    forming a patterned photoresist layer on the second metal layer, wherein the patterned photoresist layer comprises a first portion having a surrounding portion and an opening encircled by the surrounding portion, the opening exposing a portion of the second metal layer and aligned with the data pad;
    patterning the second metal layer, the insulating layer and the semiconductor layer to form a second patterned metal layer, a patterned insulating layer and a patterned semiconductor layer, and removing a portion of the patterned photoresist layer, wherein a portion of the second patterned metal layer, a portion of the patterned insulating layer and a portion of the patterned semiconductor layer form a stacked structure having a through hole exposing a portion of the data pad, and the stacked structure covers an edge of the data pad;
    heating the other portion of the patterned photoresist layer such that the other portion of the patterned photoresist layer is fluidized and transformed into a protective layer to cover a side wall of the second patterned metal layer, a side wall of the patterned insulating layer, a side wall of the patterned semiconductor layer, the stacked structure and a portion of the first patterned metal layer; and
    forming a pixel electrode on the substrate and the protective layer, wherein the pixel electrode is electrically connected to another portion of the first patterned metal layer exposed out of the protective layer.

2. The method according to claim 1, wherein forming the first patterned metal layer comprises forming a drain electrode and a source electrode, and forming the second patterned metal layer comprises forming a gate electrode.

3. The method according to claim 1, wherein the second patterned metal layer, the patterned insulating layer and the patterned semiconductor layer have a substantially identical pattern.

4. A method for manufacturing an active array substrate, comprising:
    forming a first patterned metal layer on a substrate, wherein the first patterned metal layer comprises a drain electrode, a source electrode and a data pad;
    sequentially forming a semiconductor layer, an insulating layer and a second metal layer to cover the drain electrode, the source electrode and the data pad on the substrate;
    forming a patterned photoresist layer on the second metal layer, wherein the patterned photoresist layer comprises a first portion, a second portion and a third portion, the first portion has a surrounding portion and an opening exposing a portion of the second metal layer, the opening is surrounded by the surrounding portion, the second portion has an inner portion and a peripheral portion surrounding the inner portion, and the inner portion has a thickness less than a thickness of the peripheral portion;
    patterning the second metal layer, the insulating layer and the semiconductor layer to form a surrounding wall under the first portion, a gate pad under the second portion, and a stack structure of a gate electrode, a gate insulating layer and a channel layer under the third portion, and removing the inner portion of the second portion to expose a portion of the gate pad, wherein the surrounding wall surrounds the data pad, and the channel layer is connected with the drain electrode and the source electrode;
    heating a remained portion of the patterned photoresist layer such that the remained portion of the patterned photoresist layer is fluidized and transformed into a protective layer to cover the gate electrode, the gate insulating layer, the channel layer, the surrounding wall and an edge of the gate pad, wherein a portion of the drain electrode is exposed out of the protective layer; and
    forming a pixel electrode on the substrate and the protective layer, wherein the pixel electrode is electrically connected to the exposed portion of the drain electrode.

5. The method according to claim 4, wherein the step of forming the first patterned metal layer comprises forming a data line, and the step of patterning the second metal layer comprises forming a gate line.

6. The method according to claim 5, wherein the patterned photoresist layer further comprises a fourth portion disposed over both the data line and the gate line.

7. The method according to claim 4, wherein the step of patterning the second metal layer, the insulating layer and the semiconductor layer comprises allowing a portion of the data pad to be exposed.

8. The method according to claim 4, wherein the step of patterning the second metal layer, the insulating layer and the semiconductor layer comprises sequentially etching the second metal layer by a dry etching process, and etching the insulating layer and the semiconductor layer by a wet etching process.

9. The method according to claim 4, wherein the step of heating the remained portion of the patterned photoresist layer comprises subjecting the remained portion of the patterned photoresist layer to an environment at a temperature of about 200° C. to about 400° C.

10. An active array substrate, comprising:
    a substrate;
    a source electrode and a drain electrode both disposed on the substrate;
    a data pad formed on the substrate;
    a channel layer disposed on the source electrode and the drain electrode;
    an insulating layer disposed on the channel layer;
    a gate electrode disposed on the insulating layer, wherein the channel layer, the insulating layer and the gate electrode have a substantially identical pattern;

a stacked structure of a semiconductor material, an insulating material and a metal material, the stacked structure having a through hole exposing a portion of the data pad and covering an edge of the data pad;

a protective layer covering the channel layer, the insulating layer, the gate electrode, the source electrode, a portion of the drain electrode and the stacked structure; and a pixel electrode disposed on the substrate and the protective layer, the pixel electrode being electrically connected to the drain electrode.

* * * * *